Nov. 19, 1957 C. A. CIBELIUS, JR., ET AL 2,813,934

TRANSISTOR AMPLIFIER

Filed Dec. 28, 1953

INVENTOR.
Charles A. Cibelius, Jr.
Donald K. Schaeve
BY Carlson, Pitzner, Hubbard & Wolfe
ATTORNEYS 2,813,934

TRANSISTOR AMPLIFIER

Charles A. Cibelius, Jr., and Donald K. Schaeve, Rockford, Ill., assignors to Barber-Colman Company, Rockford, Ill., a corporation of Illinois Application December 28, 1953, Serial No. 400,702

4 Claims. (Cl. 179—171)

This invention relates to transistor amplifiers and one object is to provide a novel transistor amplifier of high gain in which the relation of the output signal to the input signal is substantially linear and the output is substantially constant, in spite of variations in the ambient temperature.

Another object is to provide an amplifier having two transistors interconnected with a signal source in a novel manner to apply the full signal from the source to the input of each transistor.

A further object is to increase the gain of the amplifier by confining the output current of at least one transistor to a path including the signal source so as to utilize the internal impedance of the latter for producing positive feedback in the amplifier.

Other objects and advantages of the invention will become apparent from the following detailed description taken in connection with the accompanying drawings, in which.

Figure 1:
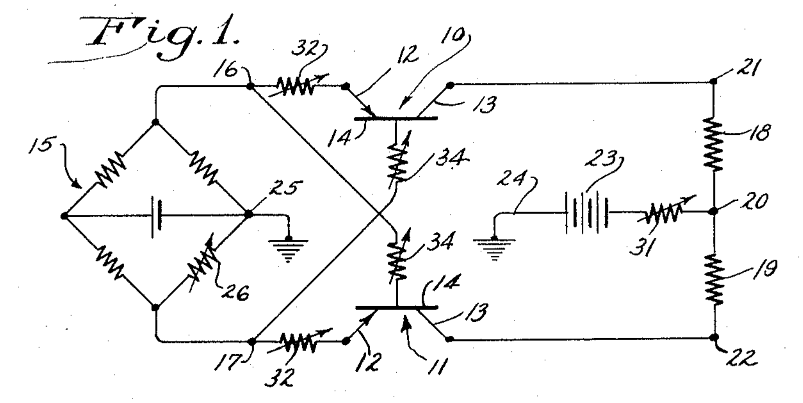
Figure 1 is a schematic wiring diagram of a transistor amplifier embodying the novel features of the present invention.

The invention is shown in the drawings for purposes of illustration embodied in an amplifier including first and second transistors 10 and 11 of the three terminal type each having an emitter electrode 12, a collector electrode 13, and a base electrode 14. An input signal from a source 15 is applied to first and second input terminals 16 and 17 of the amplifier and the output signal appears across two output impedance elements 18 and 19, herein resistors of substantially equal value having a common junction 20 and connected in series opposed relation between the output electrodes, herein the collectors 13, of the two transistors. The remote terminals 21 and 22 of the two load resistors constitute first and second output terminals respectively of the amplifier. In the present instance, the signal source 15 is a direct current bridge whose output terminals are connected to the amplifier input terminals 16 and 17 and which includes as one of its legs a resistance element 26 responsive to a condition such as temperature.

Power for the amplifier is supplied by a source 23 which, in this instance, is unidirectional and which, for a purpose to appear later, preferably is common to the output or collector circuits of the two transistors, one terminal of this source being connected to the common junction 20 between the load impedances. When point-contact transistors or p-n-p junction transistors are used, the negative side of the power supply is connected through the junction 20 and the load resistors 18 and 19 to the collectors 13 as shown, the polarity being reversed where n–p–n junction transistors are used.

In accordance with one aspect of the present invention, the two transistors 10 and 11 are interconnected in a novel manner with each other and the signal source 15 to enable substantially the full output of the latter to be applied between the input electrodes of each transistor. For this purpose, the input electrodes of one transistor, herein the base 14 and the emitter 12, are connected to spaced points of the signal source 15 and the corresponding electrodes of the other transistor are connected in reversed relation to substantially the same points of the source. In this instance, the input electrodes of the two transistors are connected to each other and to the amplifier input terminals 16 and 17 and, through the latter, to the same two points, the output terminals, of the signal source. Thus, the emitter 12 of the first transistor 10 is connected to the first input terminal 16 and the base 14 thereof is connected to the second input terminal 17. Conversely, the emitter 12 of the second transistor 11 is connected to the second input terminal 17 and the base 14 thereof is connected to the first terminal 16.

Where, as in the present instance, the power supply 23 is common to the collector or output circuits of the two transistors 10 and 11, cross connection of the emitters 12 and bases 14 of the two transistors as described above is made possible by connecting the other terminal 24 of the power supply to both amplifier input terminals 16 and 17 to complete the output circuits to the emitters and bases. Also, an impedance is interposed in series in the connection between the power supply terminal 24 and at least one of the amplifier input terminals to avoid short circuiting of the signal source. To simplify the amplifier and reduce losses therein, the internal impedance of the signal source itself is utilized to prevent such short circuiting by connecting the power supply terminal 24 to some point 25 of the source to interpose the impedance of the latter between the power supply and at least one of the amplifier input terminals. In the present instance, this connection is made through ground as shown.

When the transistors 10 and 11 are of the type such as point-contact transistors whose current gain, that is the ratio of change of collector current to change of emitter current, is greater than unity in the normal operation of the transistors, inclusion of the signal source 15 with its internal impedance in the output circuit of at least one transistor results in positive feedback between this output circuit and the inputs of the two transistors. Such feedback preferably is obtained from the output circuits of both transistors 10 and 11 by making the grounded point 25 of the signal source 15 an intermediate point so that each output circuit includes a part of the source impedance. In the present instance, the grounded point 25 is the midpoint of the signal source 15 and the latter constitutes a push-pull type of source. With this circuit arrangement, the collector circuit of each of the transistors 10 and 11 extends from the collector 13 first through the associated load resistor, then through the power supply 23 to ground, and finally to the base 14 and the emitter 12 through the signal source and the midpoint 25 of the latter.

Under a balanced condition when the output of the signal source 15 and therefore the potential difference between the input terminals 16 and 17 is zero, current flows in approximately equal amounts in the collectors of the two transisters 10 and 11 so that the voltage drops across the load resistors 18 and 19 are substantially equal and opposite with a zero output voltage appearing across the amplifier output terminals 21 and 22. Similarly, the voltage drops in the signal source 15 produced by the flow of the collector currents in opposite directions from ground to the respective input terminals are approximately equal and opposite so that the input terminals remain substantially at the same potential. With the load resistors 18 and 19 connected in opposed relation, changes in temperature and, due to the fact that the power supply 23 is common to the two collector circuits, changes in the power supply voltage result in approximately equal changes in the collector currents so that the amplifier output voltage remains substantially constant.

Upon an increase of the potential of the first input terminal 16 over that of the second input terminal 17, the emitter 12 of the first transistor 10 becomes positive with respect to its base 14 and the emitter of the second transistor 11 becomes negative relative to its base. As a result, the collector current of the first transistor increases and the collector current of the second transistor 11 decreases correspondingly. Under this condition, the voltage drop across the first load resistor 18 is larger than that across the second resistor 19 so that a voltage appears between the output terminals with the first terminal 21 more positive than the second terminal 22. An output voltage of opposite polarity appears across the output terminals 21 and 22 when the polarities of the input terminals 16 and 17 are reversed so that the second terminal 17 is more positive than the first terminal 16.

In the case where each of the transistors 10 and 11 normally has a current gain greater than unity, the base current flow between the collector and the base is toward the latter. Thus, upon an increase in the potential of the first input terminal 16 over that of the second terminal 17 and the resulting increase of emitter, collector, and base currents of the first transistor 10, the base current of the latter, in flowing from ground through the signal source 15 and toward the second input terminal 17, produces a voltage drop tending to make the latter more negative. At the same time, the base current of the second transistor and therefore the voltage drop produced thereby in the signal source are reduced. This tends to make the potential of the first input terminal 16 more positive. It will be apparent that such positive feedback between the output of each transistor and the inputs of both transistors is produced by virtue of the connection of the power supply 23 to the source to include at least part of the impedance of the latter in the output of each transistor.

Figure 2:
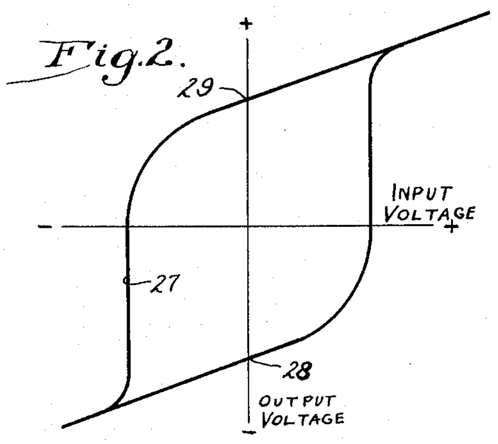
Figs. 2 and 3 are curves of the relation between the output and input voltages of the amplifier under different conditions.

The relation of the output voltage to the input voltage of an amplifier constructed as described above with transistors having current gains greater than unity tends to be non-linear as illustrated by the curve 27 in Fig. 2. Thus, the output voltage is negative when the input voltage is increasing through zero as indicated at 28 and positive as the input voltage is decreasing through zero as indicated at 29. Such non-linearity or hysteresis is believed to be due to the fact that different transistors of this type currently available not only vary as to individual characteristics including current gains and emitter and base resistance values but also are characterized by a non-linear variation of current gain with changes of emitter current.

To overcome the foregoing difficulties, the present invention, in another of its aspects contemplates maintaining the current consumed by the amplifier to a nearly constant amount and forcing the two transistors to operate in regions where their operating points shift approximately equal amounts for corresponding emitter current changes. To accomplish this, a resistor 31 having a value substantially higher than the static values of the collector and base resistances of the two transistors is connected in series with the power supply 23 and cooperates with the latter to provide a constant current source. With this arrangement, the relation between the input and output voltages of the amplifier tends to become more linear, the ideal curve of this relationship being indicated at 30 in Fig. 3. The resistor 31 functions to stabilize the total current and gain of the amplifier and may be made adjustable as shown to vary the circuit gain.

Figure 3:
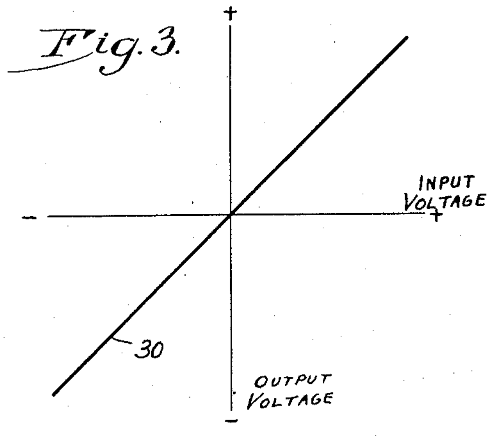

When the current gain of the transistors 10 and 11 is less than unity, the direction of flow of the base current of each transistor is reversed, that is, away from the base. Thus, inclusion of the impedance of the signal source in the collector circuits results in a negative instead of positive feedback between the output of each transistor and the input of the other transistor. It has been found however that, by virtue of the novel manner of cross connecting the inputs of the two transistors so that the full input signal is applied to each, it is still possible to use such transistors and achieve transducer gain and stability which are greater than that obtainable with amplifiers having transistors whose inputs are not cross connected as described above. Transducer gain in the case of a transistor amplifier is defined as the ratio of power obtained from the amplifier and a given signal source to the power which can be obtained with the signal source and a matched load impedance. An advantage of using transistors having current gains less than one is an output to input voltage relationship which tends to be linear as shown in Fig. 3 without the necessity of a constant current power supply as provided by the resistor 31. Also, the output voltage of the amplifier with such transistors tends to be more stable than when the current gain of each transistor exceeds unity.

The amplifier using either type of transistor may be stabilized by introducing negative feedback or degeneration between the collector 13 and one of the input electrodes 12 and 14 of each transistor. In the preferred form of the invention shown in Fig. 1, this is accomplished by inserting an impedance, herein a resistor 32, in series with the emitter 12 of each transistor. These resistors may be made variable as shown to correct for variations in the values of the emitter resistances of the two transistors.

Figure 4:
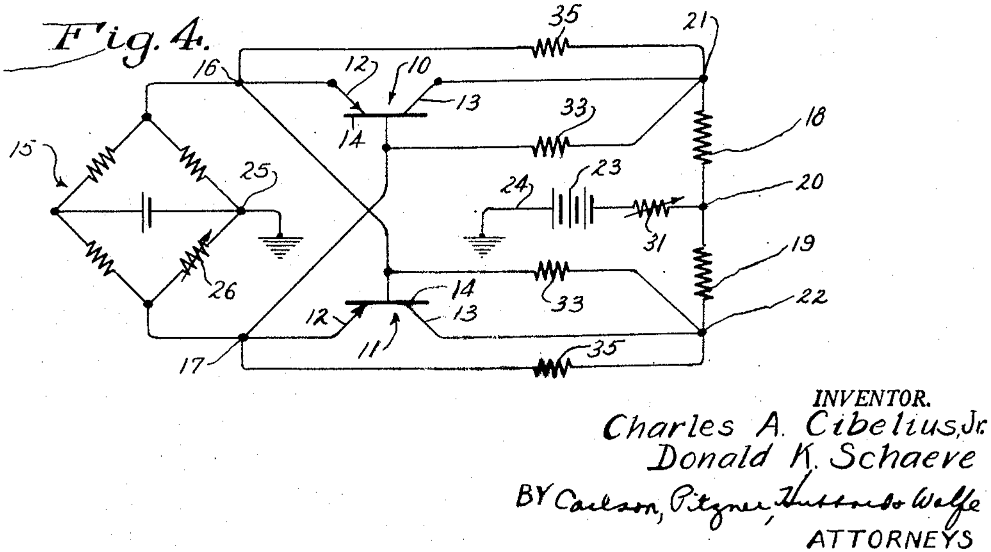
Fig. 4 is a view similar to Fig. 1 of a modified amplifier.

Another method of introducing degeneration into the amplifier is shown in a modified circuit arrangement shown in Fig. 4. Here, a separate negative feedback path including a series resistor 33 is connected between the base 14 and the collector 13 of each transistor. This circuit extends from the collector 13 through the series resistor 33 to the base 14 and by-passes the power supply 23.

When transistors having low current gain are used, the amplifier performance may be improved by introducing positive feedback between the collector 13 and one of the input electrodes 12 and 14 of each of the transistors 10 and 11. In the preferred circuit arrangement of Fig. 1, such additional positive feedback may be introduced when the current gain of the transistors is greater than unity by connecting in series with each base 14 a resistor 34 which may be made adjustable as shown to equalize the effective values of base resistance of the two transistors.

Positive feedback in the modified amplifier of Fig. 4 is achieved by a separate circuit connected between the collector 13 and the emitter 12 of each transistor and including a series resistor 35. This circuit also by-passes the power supply 23 and extends from the collector through the resistor 35 to the emitter.

From the foregoing, it will be apparent that by virtue of the novel manner of cross connecting the inputs of the two transistors 10 and 11 each of the latter receives the entire input signal. This plus the positive feedback introduced by elements such as the resistors 34 and, in the case where the current gain of each transistor exceeds unity, by the impedance of the signal source insures a high gain for the amplifier. Stability is achieved while still providing high gain by inserting the resistor 31 in series with the power supply 23 when the transistors have current gains greater than unity and by introducing degeneration between the collector 13 and either of the emitter or base electrodes 12 and 14 of each transistor.

We claim as our invention:

1. The combination of a source providing a signal to be amplified and having first and second end terminals and a center terminal between the end terminals, first and second transistors each having a base, an emitter and a collector, an input circuit for said first transistor extending from said base thereof to said first end terminal, through the source to said second end terminal and from the latter to the emitter of the transistor for application to the circuit of substantially the entire signal from the source, an input circuit for said second transistor extending from said base thereof to said second end terminal, through said source to said first terminal and from the latter to the emitter of the second transistor for application to the circuit of said entire signal which is applied to said first transistor input circuit, a pair of load impedance elements connected in series between said collectors and to each other at a junction, and a common collector power supply connected between said junction and said center terminal to complete an output circuit for each transistor extending from said collector thereof through the associated load impedance element, the power supply and approximately half of said source.

2. The combination of a source providing a signal to be amplified, first and second transistors each having a base, an emitter and a collector, an input circuit for said first transistor extending from said base thereof to a first point on said source, through the latter to a second point and from the second point to the emitter whereby the signal applied by the source to the input circuit is the signal between the two points, an input circuit for said second transistor extending from said base thereof to said second point of said source, from the second point through the source to said first point and from the latter to said emitter of the second transistor for application to the circuit of substantially the same signal from the source as is applied to said input circuit of said first transistor, a pair of load impedance elements connected in series between said collectors and to each other at a junction, said source having a third point intermediate said first and second points, and a common collector power supply connected between said junction and said third point to complete an output circuit for each transistor extending from said collector thereof through the associated impedance element, the power supply and a part of said source.

3. The combination of a source providing a signal to be amplified, first and second transistors each having a base, an emitter and a collector, an input circuit for said first transistor extending from said base to said emitter thereof through said source for application to the circuit of substantially the entire signal from the source, an input circuit for said second transistor extending from said base to said emitter thereof through said source for application to the circuit of substantially said entire signal of the source, the base of each of said transistors being connected to the emitter of the other transistor through an input current conductive path, two load impedance elements connected in series between said collectors and to each other at a junction, and a common collector power supply connected between said junction and a point on said source to complete output circuits for said transistors, at least one of said output circuits extending through a part of said source.

4. The combination of a source providing a signal to be amplified, first and second transistors each having a base, an emitter and a collector, an input circuit for said first transistor extending from said base to said emitter thereof through said source for application to the circuit of substantially the entire signal from the source, an input circuit for said second transistor extending from said base to said emitter thereof through said source for application to the circuit of substantially said entire signal of the source, the base of each of said transistors being connected to the emitter of the other transistor through an input current conductive path, and two output circuits one for each of said transistors and each extending from the collector to the emitter of the associated transistor through a load impedance element and a collector power supply, at least one of said output circuits extending through a part of said signal source and including the impedance of said part.

References Cited in the file of this patent

UNITED STATES PATENTS

| | | |
|---|---|---|
| 2,517,960 | Barney et al. | Aug. 8, 1950 |
| 2,641,638 | Pantchechnikoff | June 9, 1953 |
| 2,647,957 | Mallinckrodt | Aug. 4, 1953 |
| 2,647,958 | Barney | Aug. 4, 1953 |
| 2,652,460 | Wallace | Sept. 15, 1953 |
| 2,663,766 | Meacham | Dec. 22, 1953 |